United States Patent [19]

Halberstam et al.

[11] Patent Number: 5,561,429

[45] Date of Patent: Oct. 1, 1996

[54] CONTENT LIMIT ADDRESSABLE MEMORY

[75] Inventors: M. Halberstam, Brooklyn, N.Y.; James E. Meister, Wayne, N.J.; Moshe Mazin, Andover, Mass.; Dennis A. Henlin, Dracut, Mass.; Jun-ichi Sano, Chelmsford, Mass.; Edward T. Lewis, Sudbury, Mass.

[73] Assignee: Raytheon Company, Lexington, Mass.

[21] Appl. No.: 852,877

[22] Filed: Apr. 16, 1986

[51] Int. Cl.$^6$ .................................................. G06F 7/02
[52] U.S. Cl. .............................................. 342/14; 395/427
[58] Field of Search ................................. 364/200, 900; 342/14–16; 395/400, 425

[56] References Cited

U.S. PATENT DOCUMENTS

| | | | |
|---|---|---|---|
| 3,938,096 | 2/1976 | Brown et al. | 364/200 |
| 4,025,920 | 5/1977 | Reitboeck et al. | 342/14 |
| 4,055,851 | 10/1977 | Jenkins et al. | 364/900 |
| 4,149,239 | 4/1979 | Jenkins et al. | 364/200 |
| 4,217,580 | 8/1980 | Lowenschuss | 342/14 |
| 4,374,309 | 2/1983 | Bienvenu et al. | 364/200 |
| 4,547,849 | 10/1985 | Louie et al. | 364/200 |

OTHER PUBLICATIONS

"Window Addressable Memory", TRW, Jan. 1982, pp. 439–440, 3-1 to 3-13.
IBM Data Sheet, pp. 2–3.

Primary Examiner—Salvatore Cawgialosi
Attorney, Agent, or Firm—Donald F. Mofford

[57] ABSTRACT

A content limit addressable memory (CLAM) having a plurality of lower and upper limits stored therein for comparison to corresponding subfields of an input word. Each corresponding upper and lower limit forms a bracket. Corresponding brackets form a window. The brackets correspond to the subfields and are of the same number of bits. The brackets and subfields are alterable in width to allow each bracket and subfield to have any number of bits in multiples of two. A valid match of the input word with any window can occur with any combination of the brackets of a window matching or not matching the corresponding subfields of the input word. A plurality of outputs corresponding to each of the windows indicates a match of the corresponding window to the input word. Additionally, the CLAM can compare data stored therein against an applied window with the matching operations as described above.

4 Claims, 9 Drawing Sheets

CONTENT LIMIT ADDRESSABLE MEMORY

BACKGROUND OF THE INVENTION

This invention relates generally to content addressable memories and, more particularly, to content addressable memories for matching data between limits.

In electronic warfare systems, characterizing an unknown radio frequency (R.F.) emitter (typically a radar) is necessary for determining what countermeasure are to be applied to reduce that R.F. emitter's effectiveness since one countermeasure is more effective than another. Therefore, to determine what type of countermeasure is to be used, the unknown R.F. emitter is classified or binned by the "signature" of the signal received therefrom. Typical characteristics of this "signature" are frequency, angle of arrival, time of arrival, pulse amplitude and pulse width. The characteristics of an unknown R.F. emitter are determined by a parameter measuring unit, the Datameter measuring unit being responsive to a plurality of receivers of the radiation from the unknown R.F. emitter. When the received signal characteristics match the characteristics of a known R.F. emitter, the R.F. emitter is thereby binned and the appropriate countermeasure is applied. The matching of characteristics is typically done by a digital computer. The characteristics of the "signature" of any R.F. emitter may have a range of values, e.g., the R.F. emitter operates over a band of frequencies; the pulse amplitude may vary over a large range, etc. The range of values for the characteristics of a known R.F. emitter is called a window, in which the characteristics of an unknown R.F. emitter must fall to be classified as being of the same type as the known R.F. emitter. The range of values for each characteristic is defined by a pair of limits, the pair of limits is called a bracket. Each window is composed of brackets, each bracket corresponding to a characteristic of the known R.F. emitter. Therefore, the digital computer binning an R.F. emitter's "signature" must compare the characteristics of that "signature" with the range of values for the characteristics associated with each type of known R.F. emitter. If there are many known types of R.F. emitters and many different characteristics of the "signature" of each, much time is used by the computer in matching the unknown R.F. emitter to a known R.F. emitter and the effectiveness of a given countermeasure is reduced because of the length of time after receiving a signal from an unknown R.F. emitter to the use of an appropriate countermeasure. One way to reduce the delay in application of an appropriate countermeasure is the use of simultaneous, or parallel, comparisons of the characteristics of the received "signature" with limits associated with each characteristic (bracket) of a known R.F. emitter (window). Such comparisons are done in parallel for each characteristic of an unknown R.F. emitter and for each type of known R.F. emitter, e.g., if there are N known R.F. emitter types (windows) and M brackets for each window, NXM simultaneous comparisons must be made. To achieve this parallelism, the characteristics for each R.F. emitter compose a large binary word and the computer acts on that word as a whole. However, the number of characteristics needed to classify a given R.F. emitter may require a word width which is neither practical nor necessary for all types of R.F. emitters. For example, one emitter could be classified by its frequency and pulse amplitude only, but another type of emitter needs to be classified by frequency, pulse amplitude, pulse width and angle of arrival. Should the word width be a size sufficient for frequency and pulse rate characteristics only, then a time consuming and inefficient second comparison is necessary for the pulse width and angle of arrival characteristics.

A device that does parallel processing of data is known as a content addressable memory (CAM). A CAM determines which stored data words exactly match an input word. However, no comparisons between limits is implemented. A similar type of memory, a window addressable memory (WAM) Performs comparisons between fixed width subfields of an input word and the brackets for each window stored in the WAM, each subfield corresponding to a characteristic of a known R.F. emitter. A window match occurs when all of the subfields of the input word (unknown R.F. emitter's "signature") are within all of the corresponding brackets for a window (a known R.F. emitter). However, the number of bits in each subfield cannot be changed for processing different kinds of data. Additionally, since a window match occurs with all brackets of a window matching the corresponding subfields, no provision is provided for disabling selected ones of the bracket matches for a window match nor allowing a window match if selected ones of the brackets do not match the corresponding subfields.

SUMMARY OF THE INVENTION

It is therefore an object of this invention to provide a memory allowing the simultaneous comparison of subfields of an applied input word to a plurality of corresponding stored limit pairs (brackets), corresponding ones of the plurality of brackets forming windows, the subfields having a predetermined width selected by a utilization device.

A further object of this invention is to provide a window match indication upon match or no match conditions, or combinations thereof, for each subfield to corresponding bracket comparison in each window, the combinations of the conditions being predetermined by the utilization device.

An additional object of the invention is to adapt the memory to allow comparisons between stored data and an applied input window.

These objects and other objects of this invention are obtained generally by having an integrated circuit Content Limit Addressable Memory (CLAM) having a memory array for storing the bracket data representing the emission characteristics of the known RF emitters, and comparators for comparing the bracket data with the input word containing the emission characteristics of the unknown RF emitter. The windows are partitioned into five or less brackets and the input word into corresponding subfields. Output of the comparison for each bracket in each window is coupled to a decision logic circuit to determine which window matches the input word. In an alternative mode of operation, the array of memory cells stores data having subfields to be compared against an applied input window. In this case, the decision logic determines which stored data word matches the input window.

BRIEF DESCRIPTION OF THE DRAWINGS

The foregoing features of this invention, as well as the invention itself, may be more fully understood from the following detailed description of the drawings, in which.

DESCRIPTION OF THE PREFERRED EMBODIMENT

Figure 1:
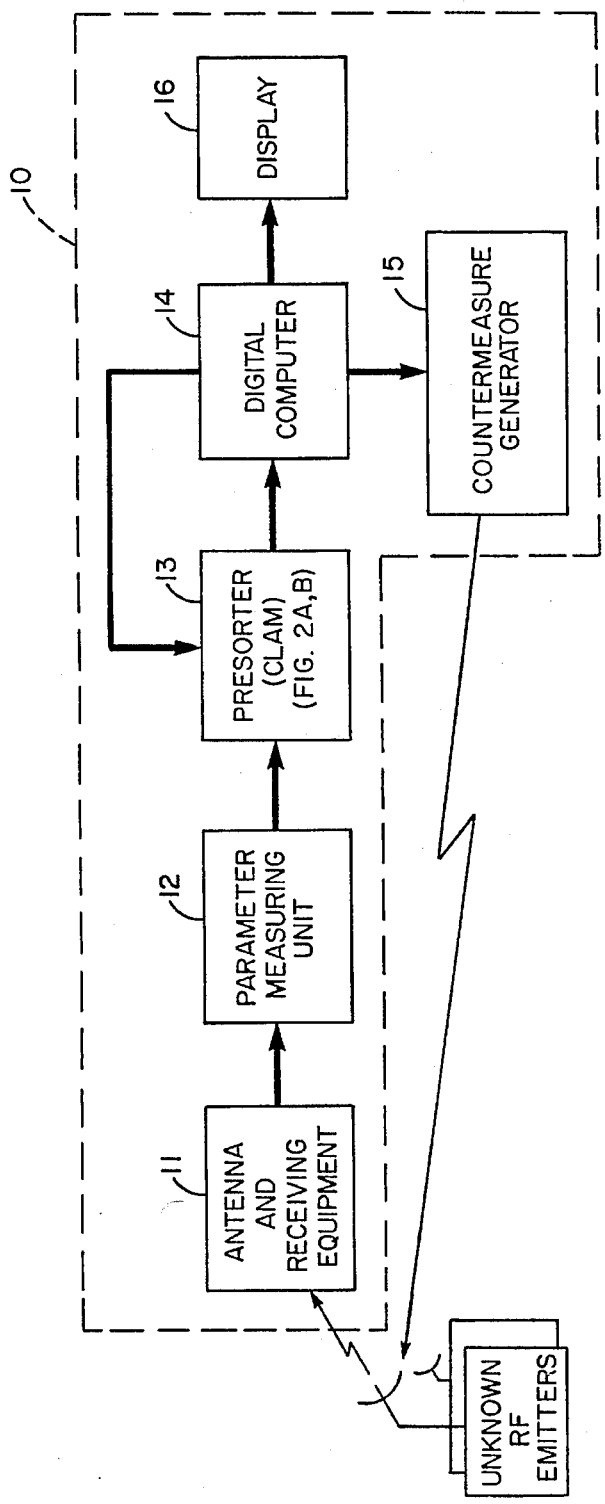
FIG. 1 is a block diagram of an electronic countermeasure apparatus using a presorter according to this invention.
Figure 3:
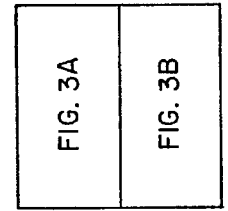
FIG. 3 shows the relationship between FIGS. 3A, 3B.

A preferred embodiment of the improved electronic countermeasure apparatus 10 here contemplated is diagrammed in FIG. 1. It is noted that operation of apparatus 10 is not limited to radio frequencies (R.F.) but could be adapted by those skilled in the art to operate at acoustical or optical frequencies. Antenna and receiving equipment 11 of conventional design is adapted to receive R.F. emissions from unknown R.F. emitters (not numbered). The received R.F. emissions are coupled from the antenna and receiving equipment 11 to a parameter measuring unit 12 wherein such emissions are converted into digital words representing various selected characteristics of the R.F. emission, e.g., frequency, angle of arrival, time of arrival, pulse amplitude and pulse width that may be combined as desired to form the "signature" of each one of the unknown R.F. emitter's. An example of the parameter measuring unit 12 is disclosed in U.S. Pat. No. 4,217,580 issued to O. Lowenschuss on Aug. 12, 1980. The digital words from the parameter measuring unit 12 are coupled to a presorter 13, here a content limit addressable memory (CLAM) for identification (or binning) of the signatures of the unknown R.F. emitters. The presorter 13 has stored therein digital words representative of the R.F. emission characteristics of each one of a plurality of known R.F. emitters. Each of the stored digital words define predetermined ranges of values of the characteristics forming the signature of each known R.F. emitter. When a digital word is applied to the presorter 13 from the Datameter measuring unit 12 describing the measured emission characteristics of the received R.F. emission of an unknown R.F. emitter, each characteristic of the received emission is compared with the predetermined range of values of the corresponding characteristic for each one of the plurality of known R.F. emitters. The presorter 13 then indicates to digital computer 14, of conventional design, which known R.F. emitter (or emitters) has a "signature" matching the "signature" of the unknown R.F. emitter. The digital computer 14 then instructs countermeasure generator 15 to apply a predetermined countermeasure which will most likely neutralize the effectiveness of the previously unknown R.F. emitter, if that emitter is identified to be hostile. However, if the unknown R.F. emitter is identified as being friendly, no countermeasure would be applied. The presorter 13 is also responsive to the digital computer 14 or loading the predetermined range of values for the characteristics of each one of the plurality of known R.F. emitters and controlling the comparisons between the measured characteristics of the unknown R.F. emitters and the stored characteristics of the known R.F. emitters. Display 16, responsive to the digital computer 14, alerts the operator (not shown) of the apparatus 10 of the status and identification of the unknown R.F. emitters.

Figure 2:
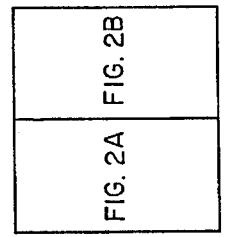
FIG. 2 shows the relationship between FIGS. 2A, 2B.
Figure 2A:
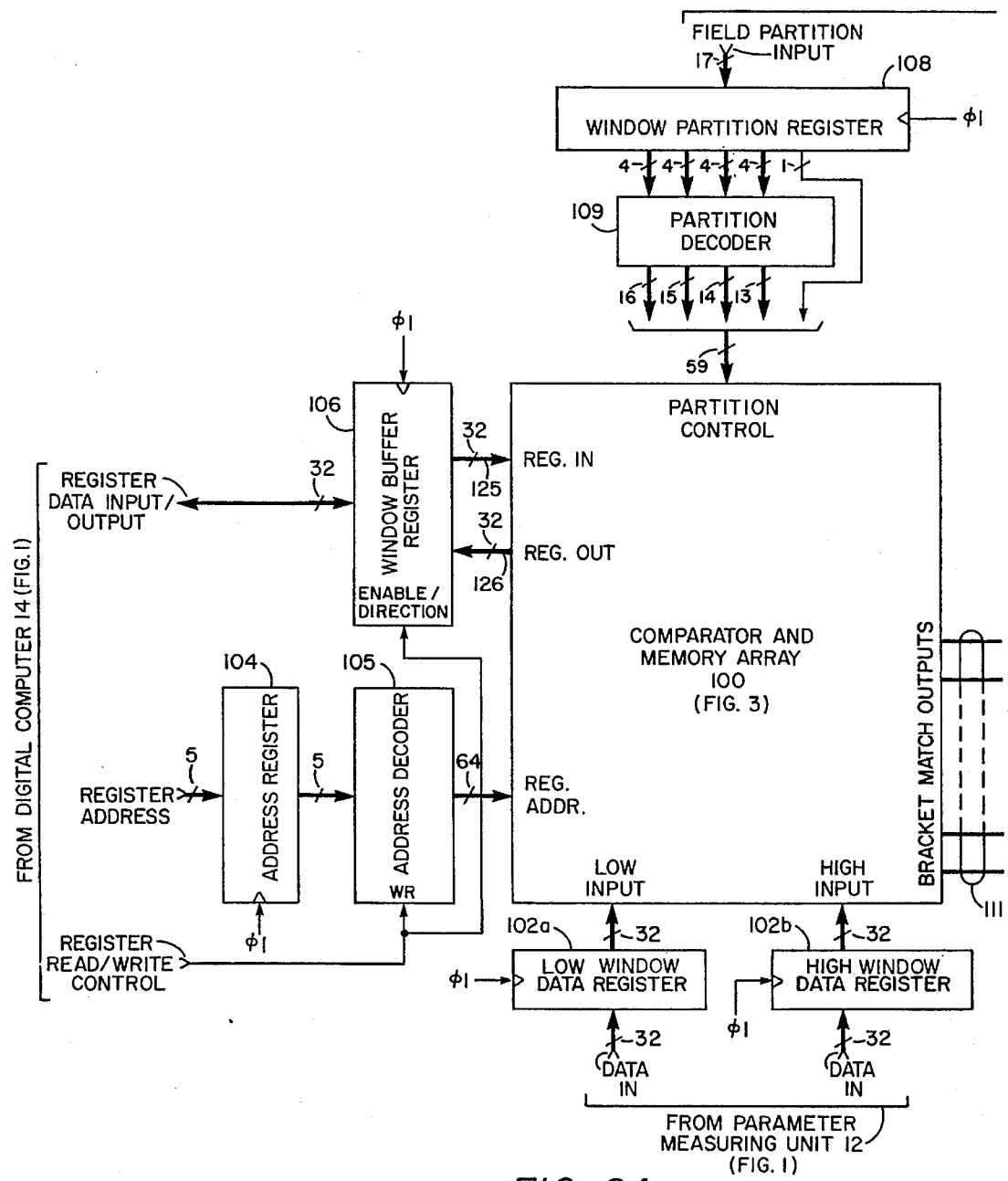
FIGS. 2A, 2B, taken together, constitute a block diagram of the presorter (CLAM) shown in FIG. 1.
Figure 2B:
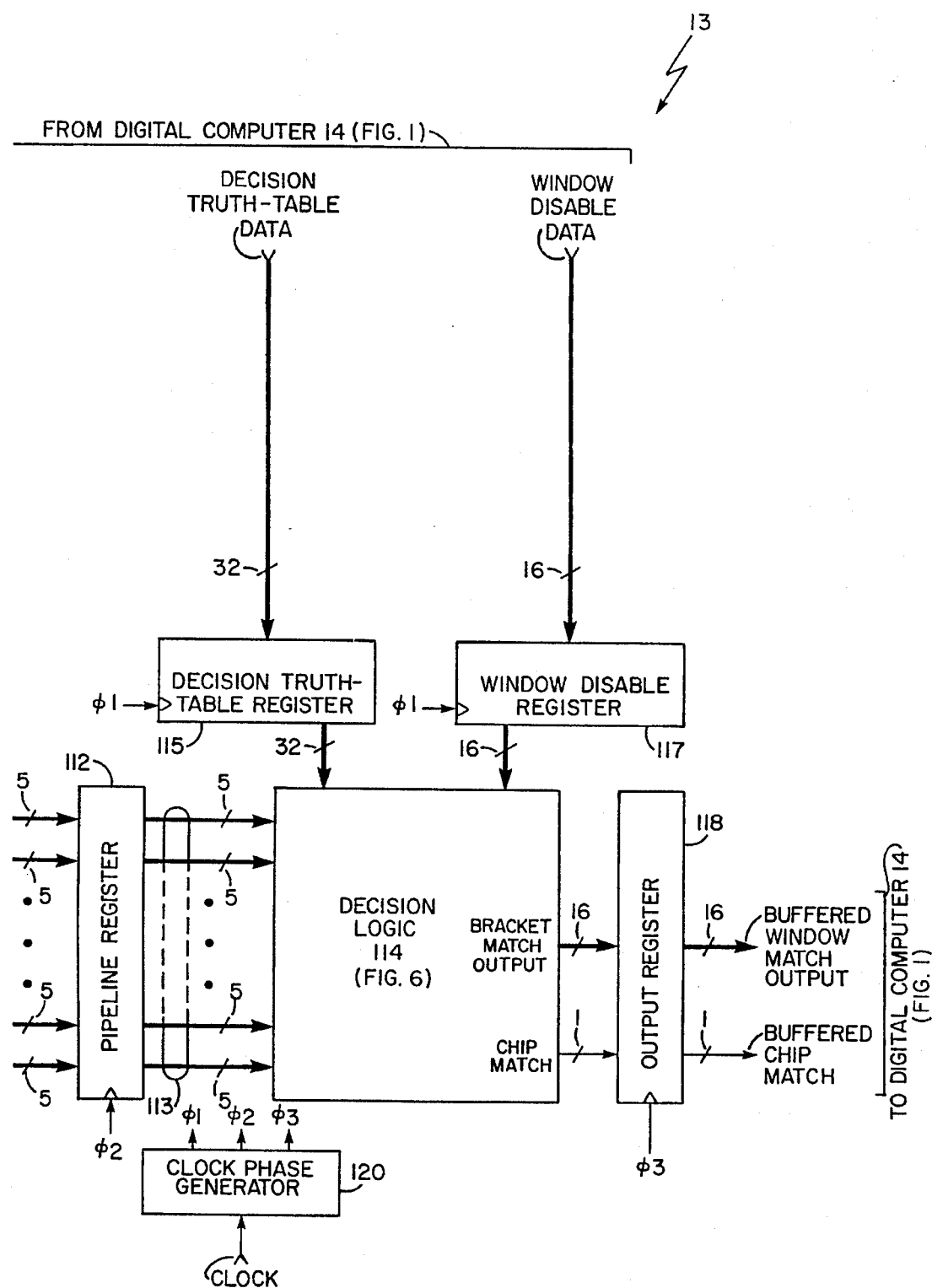

FIGS. 2A, 2B diagram the presorter 13 (FIG. 1), hereinafter referred to as a CLAM. Comparator and memory array 100 performs the matching of the characteristics of the emissions of the unknown emitters and the characteristics of the emissions of each one of a plurality of known R.F. emitters whose characteristics are stored in the comparator and memory array 100. The array 100 will be discussed in more detail below, but it is sufficient to state here that the array 100 stores the windows (characteristics of the known R.F. emitters) for comparison to an input word (the digital word from the parameter measuring unit 12 (FIG. 1) describing the characteristics of the unknown R.F. emitter, the same input word is held in both low bracket data register 102a and high bracket data register 102b) using configurable 32 bit comparators (not shown). This provides simultaneous comparisons between the windows and the input word. The windows are subdivided (partitioned) into 5 or less brackets and the input word into corresponding subfields, each bracket having a corresponding upper limit and a corresponding lower limit, with a match occuring when the corresponding subfield has a value between those limits. The memory array (not shown) which stores the 16 windows, here two sets of 16 words, each word 32 bits wide, each word accessed by address register 104 and address decoder 105. Data to and from the memory array on the array 100 is buffered by window buffer register 106. Window partition register 108 stores the partition data (creating the brackets in each window) and partition decoder 109 decodes the stored partition data for presentation to array 100. Output buses 111, here 16 five bit buses, signify which brackets (up to five) in each one of the 16 windows stored in the comparator and memory array 100 the corresponding subfields of the input word falls within or matches. Data on the output buses 111 are buffered by pipeline register 112 for presentation to decision logic 114 via buses 113. Decision logic 114 tests the results of the subfield/bracket comparison to check which window the input word matches. The decision logic 114 will be described in more detail below, but it is sufficient to state here that each 5 bit bus 113 drives a corresponding selector which in turn selects one of 32 inputs, each input coupled to a corresponding bit in the decision truth table register 115. Data stored in register 115 indicates which combination of subfield to bracket matches is a valid match of the corresponding window to the input word. Window disable register 117, coupling to decision logic 114, inhibits individual windows from indicating a match. When the input word matches at least one of the windows, the window match output of the decision logic 114 indicates which windows match. A summary bit, chip match, is also provided to indicate if any windows match the input word. Output register 118 latches the outputs from the decision logic 114. Clock phase generator 120 generates three clock pulses ∅1, ∅2, ∅3 in response to the clock input. These three clock phases ∅1, ∅2, ∅3 sequence operations in the CLAM. Clock phase ∅1 controls the entry of data in and out of the comparator and memory array 100 by clocking the address register 104, window buffer register 106, low and high window data register 102a, 102b and window partition register 108. Additionally, phase ∅1 clocks registers 115 and 117 to load data applied thereto. Once the data is clocked into the above registers in response to phase ∅1, phase ∅2 clocks the results from the array 100 into pipeline register 112 after enough delay to guarantee the outputs on buses 111 are stable. Clock phase ∅3 clocks into output register 118 output data from the decision logic 114 after a sufficient delay; from phase ∅2 to guarantee the outputs of the decision logic 114 are stable.

Figure 3A:
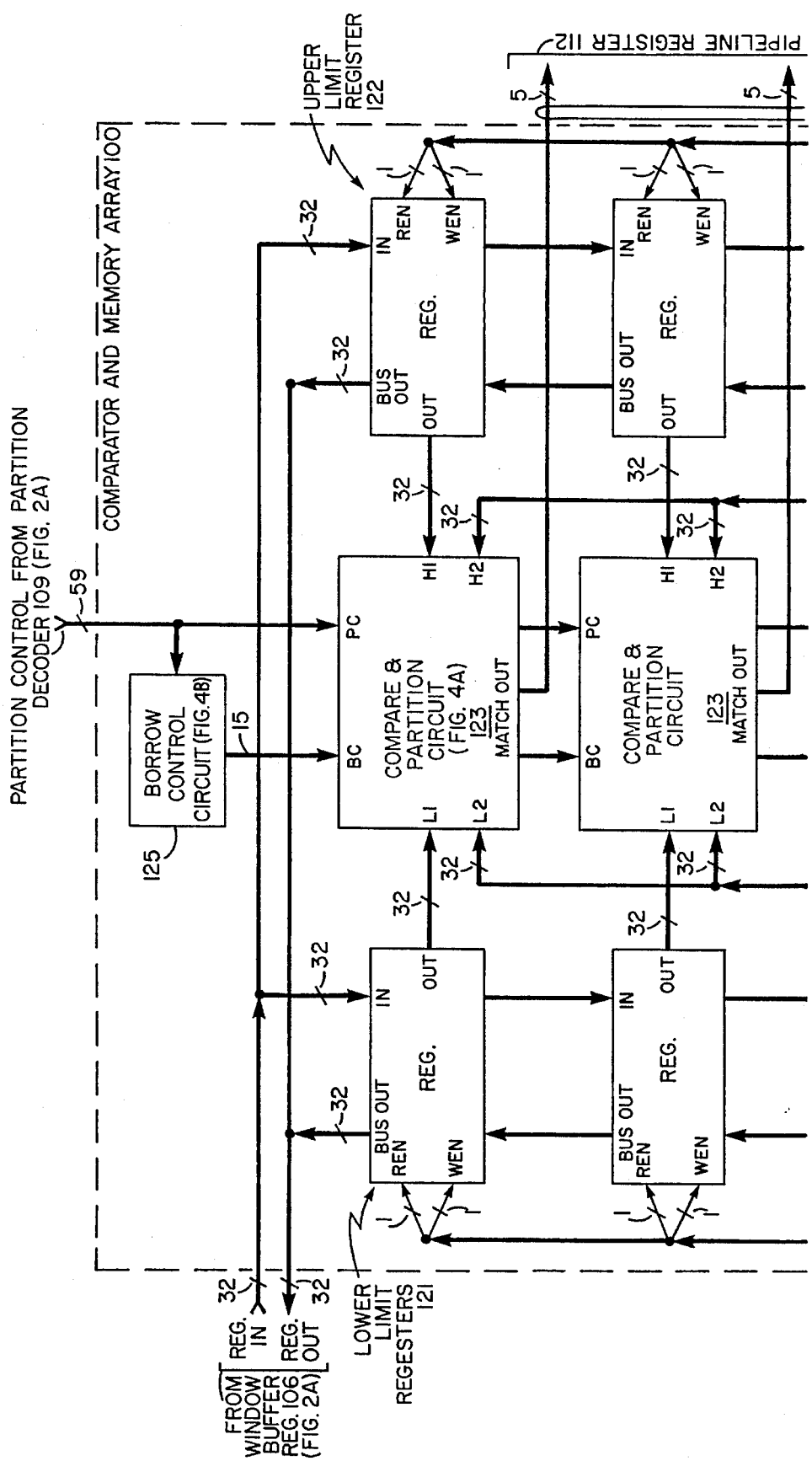
FIGS. 3A, 3B taken together, constitute a block diagram of the comparator and memory array shown in FIG. 2A.
Figure 3B:
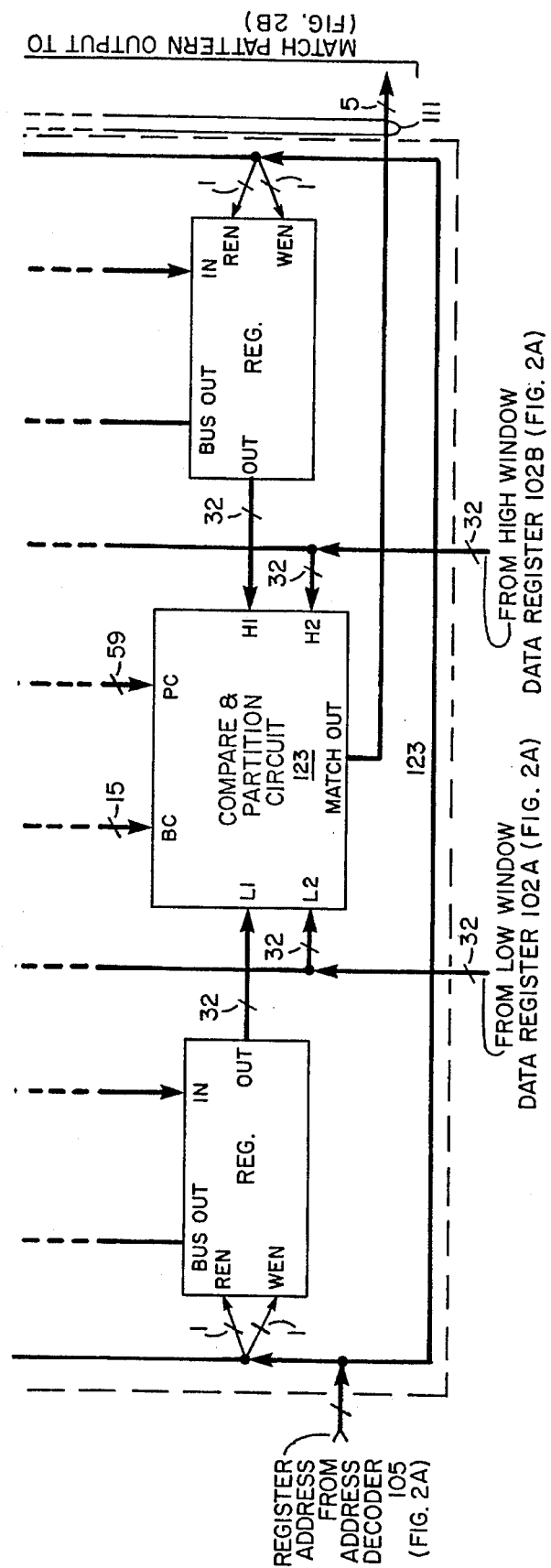

FIGS. 3A, 3B detail the comparator and memory array 100. Lower limit registers 121 store the lower limits for each window and the upper limit registers 122 store the upper limits for each window, the lower limit registers 121 having one to one correspondence with the upper limit registers 122. Each one of the lower limit registers 121 and upper limit registers 122 couples to a corresponding compare and partition circuit 123. Data is loaded into a select one of the registers 121, 122 from window buffer register 106 (FIG. 2A) when the corresponding write enable (WEN) input is active. Similarly, data is read from the select one of the registers 121, 122 to window buffer register 106 (FIG. 2A) when the corresponding read enable (REN) input is active. Data from low window data register 102a (FIG. 2A) and high window register 102b (FIG. 2A) couple to each compare and partition circuit 123. Borrow control circuit 125 will be described in more detail below, but it is sufficient to state here that it couples the partition control data from partition decoder 109 (FIG. 2A) to subtractors (not shown) in each of the compare and partition circuits 123 to generate borrow control signals in the subtractors.

Figure 4A:
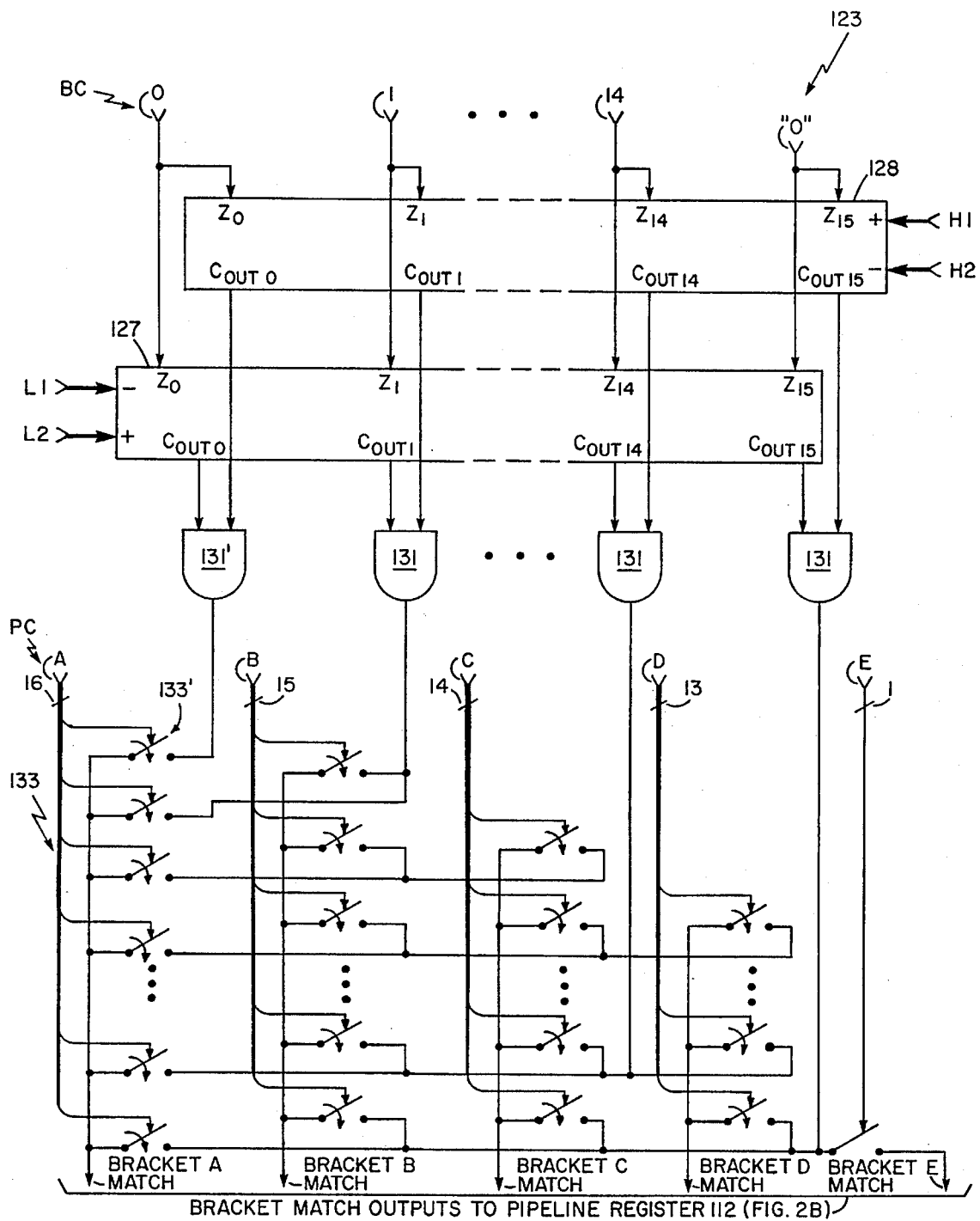
FIG. 4A is a block diagram of the compare and partition circuitry shown in FIGS. 3A, 3B.

FIG. 4A diagrams one of the compare and partition circuits 123 (FIG. 3A). Subtractor arrays 127, 128 perform the comparisons between the input data on buses L2, H2 and the brackets on buses L1, H1. Such subtractor arrays 127, 128 are of the type disclosed in U.S. patent application Ser. No. 708,185 by D. L. Montrone and E. T. Lewis, filed Mar. 4, 1985, entitled "Adder/Subtractor" and assigned to the assignee of the present invention. Briefly, operation of subtractor arrays 127, 128 are attained by using 16 conventional two bit adders (not shown) interconnected to effect the subtraction of numbers on buses H1, H2 and L1, L2 coupled to the corresponding + and inputs, − each one of the two bit adders being controlled by signals on inputs $Z_0$–$Z_{14}$ that determine the number of two bit adders that are activated at any time (the lowest order adder being always activated) and the mode of operation of the activated ones of the two bit adders so that a plurality of numbers of different lengths may be subtracted simultaneously. It is noted that inputs $Z_{15}$ of arrays 127, 128 are forced to a "0" since the $Z_{14}$ inputs controls the most significant adders (not shown) in the arrays 127, 128. Subtractor array 127 compares the lower limits in a corresponding one of the lower limit registers 121 (FIGS. 3A, 3B) on bus L1 to the input word from the low window data register 102a (FIG. 2A) on bus L2. Additionally, subtractor array 128 compares the upper limits in a corresponding one of the upper limit registers 122 (FIGS. 3A, 3B) on bus H1 to the input word from the high window data register 102b (FIG. 2A) on bus H2. Because the comparisons are done with adders (not shown), the carry outputs $C_{OUT0}$–$C_{OUT15}$ of those adders indicate the results of the comparisons. Therefore, a representative one of the carry outs $C_{OUT0}$–$C_{OUT15}$ represent the following:

$C_{OUT}$

0   + input to the subtractor array is
     less than the − input

1   + input to the subtractor array is
     greater than the − input

AND elates 131, responsive to corresponding carry outputs $C_{OUT0}$–$C_{OUT15}$, determine if the input word on buses H2, L2 (assuming here that the data on bus H2 is identical to the data on bus L2) falls within the bracket defined by the lower limit data on bus L1 and the upper limit data on bus H1. However, the output of an AND gate 131 indicating a match of a bracket is valid only for those AND gates 131 which are coupled to the carry outputs $C_{OUT0}$–$C_{OUT15}$ of the highest order adders for that bracket. A valid output of a "1" indicates that there is a match between the corresponding bracket and the corresponding subfield, i.e., the corresponding subfield has a value greater than or equal to the corresponding lower limit and less than or equal to the corresponding upper limit. Switch matrix 133, responsive to the partition decoder 109 (FIG. 2A), selectively couples the valid outputs of AND gates 131 which indicate to the five bracket match outputs, only one AND gate 131 valid output is coupled at a time to a given one of the bracket match outputs. Up to five subfields or brackets are available for partitioning of the 32 bit input word and window. These five subfields or brackets are set by the window partition register 108 (FIG. 2A). It is noted that the group of switches coupling to bracket A match output in switch matrix 133 access any one of the outputs of the 16 AND Gates 131, wherein succeeding groups of switches in switch matrix 133 for brackets B, C and D each can access one less than the previous group of switches. The final bracket, bracket E, can only couple to the output of the AND gate 131 coupled to the $C_{OUT15}$ outputs of arrays 127, 128, the carry outputs of the most significant bits of the 32 bit subtractor arrays 127, 128, or it is disabled.

Figure 4B:
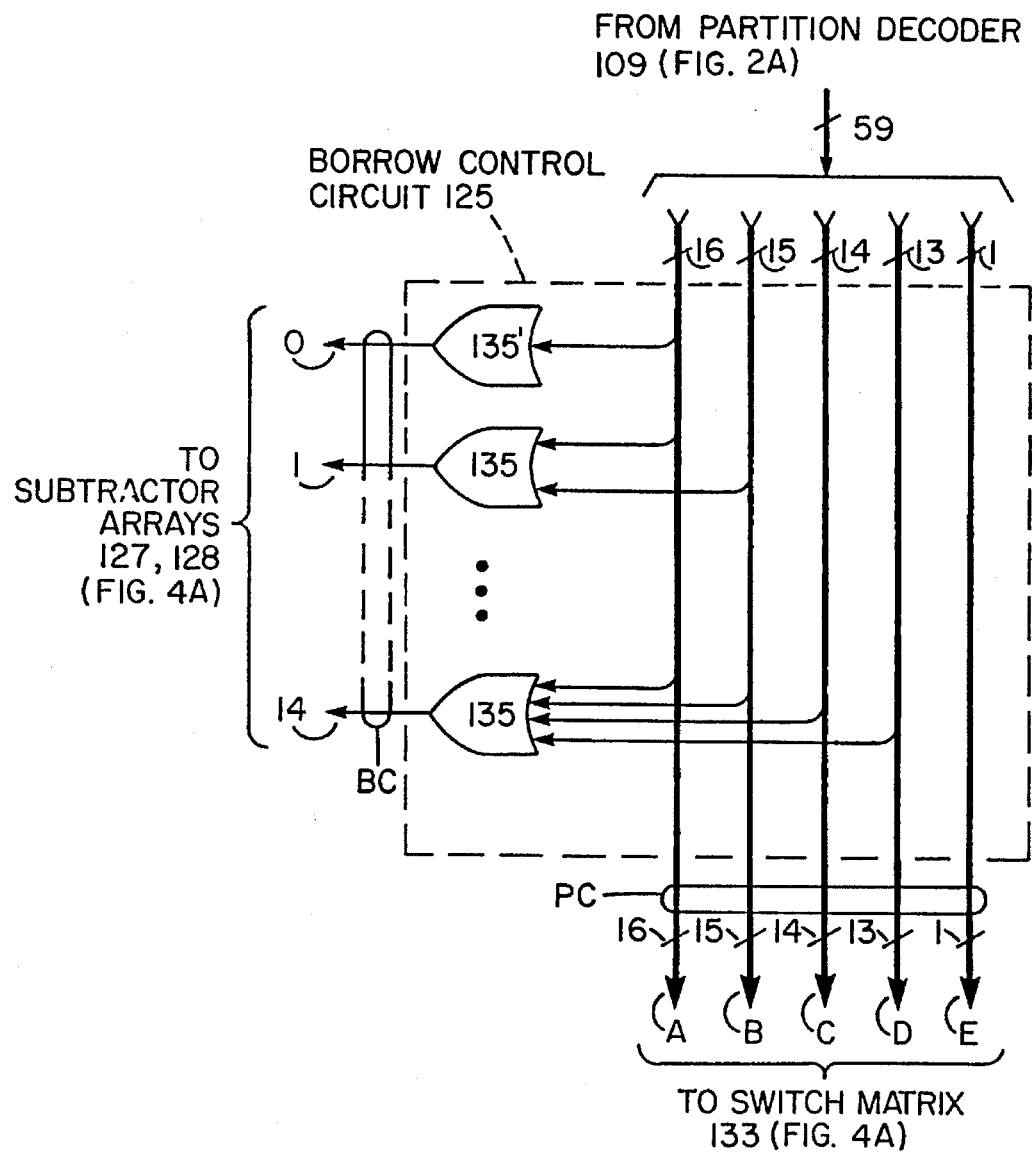
FIG. 4B is a diagram of the borrow control circuit shown in FIG. 3A.

Referring to FIG. 4B, the borrow control circuit is diagrammed. The borrow control bus (BC) input to the compare and partition circuitry 123 (FIG. 4A) is derived from the decoded partition control data from the partition decoder 109 (FIG. 2A) by the borrow control circuit 125. OR gates 135 generate the corresponding borrow control signals from the enable lines for the switches in switch matrix 133 (FIG. 4A). As discussed above, individual ones of the borrow control lines couple to corresponding control inputs $Z_0$–$Z_{14}$ on subtractor arrays 127, 128 (FIG. 4A) are selectively enabled when the corresponding switches in switch matrix 133 (FIG. 4A) are enabled. Again it is noted that because the switches in switch matrix 133 (FIG. 4A) for bracket match outputs B, C, D and E couple to less than all 16 AND gates 131 (FIG. 4A) and, hence, less than 16 enable lines are provided by the decoder 109 (FIG. 2A); the OR gates 135 that correspond to the three lowest order AND gates 131 (FIG. 4A) do not have four inputs. For example, the switches coupled to bracket A match output in the switch matrix 133 (FIG. 4A) is the only subfield match output that can test the lowest order carry, $C_{OUT0}$, outputs of subtractor arrays 127, 128 (FIG. 4A) via AND gate 131'. Therefore, OR Gate 135', operating here as a buffer, need only couple to the enable input of the switch 133' (FIG. 4A) which couples the output of the AND elate 131' (FIG. 4A) to the bracket A match output.

Figure 5:
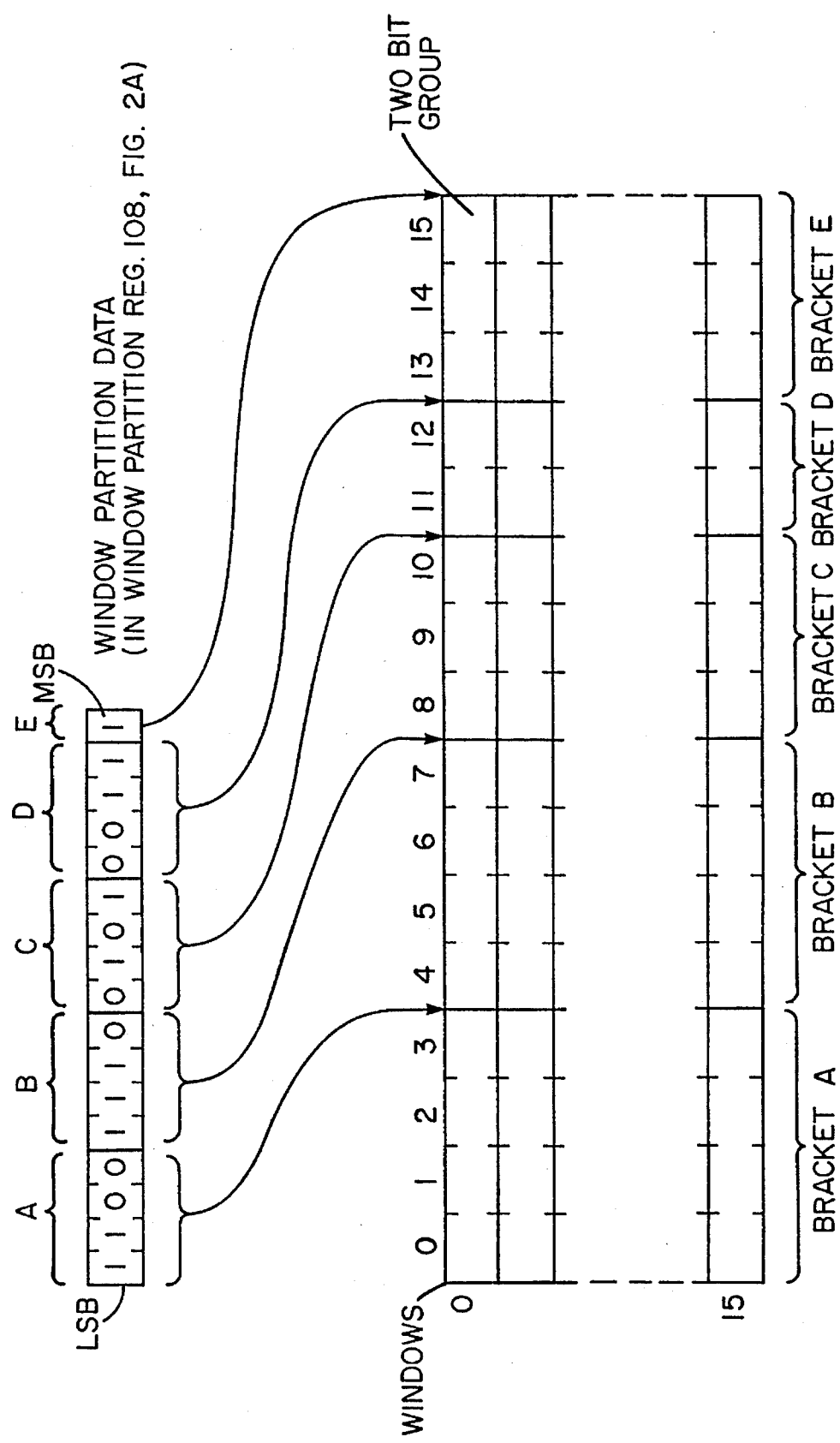
FIG. 5 is an example of the partitioning of data stored in the memory array of FIGS. 3A, 3B by the compare and partition circuitry shown in FIG. 4A.

Referring to FIG. 5, an example of the partitioning of the window data stored in the registers 121, 122 (FIGS. 3A, 3B) by the compare and partition circuitry in FIG. 4A is illustrated. The window partition register 108 (FIG. 2A) is 17 bits long, four groups of four designate which group of two bits will be the highest order ground of two bits for a bracket and, hence, which AND gate 131 output (FIG. 4A) will be valid to couple to the corresponding bracket match output (FIG. 4A). In the example illustrated here, the A bracket covers two bit group zero through three; bracket B covers groups four through seven; bracket C covers groups eight through ten; bracket D covers groups eleven and twelve; and bracket E, the remainder, thirteen through fifteen. These brackets cover all of the windows in the memory. Therefore, at each boundary between brackets, the output of the corresponding one of AND gates 131 (FIG. 4A), which are responsive to the highest order carry outputs $C_{OUT0}$–$C_{OUT15}$ of subtractor arrays 127, 128 ( FIG. 4A) at each boundary, are valid and coupled to the corresponding bracket match outputs (FIG. 4A).

Figure 6:
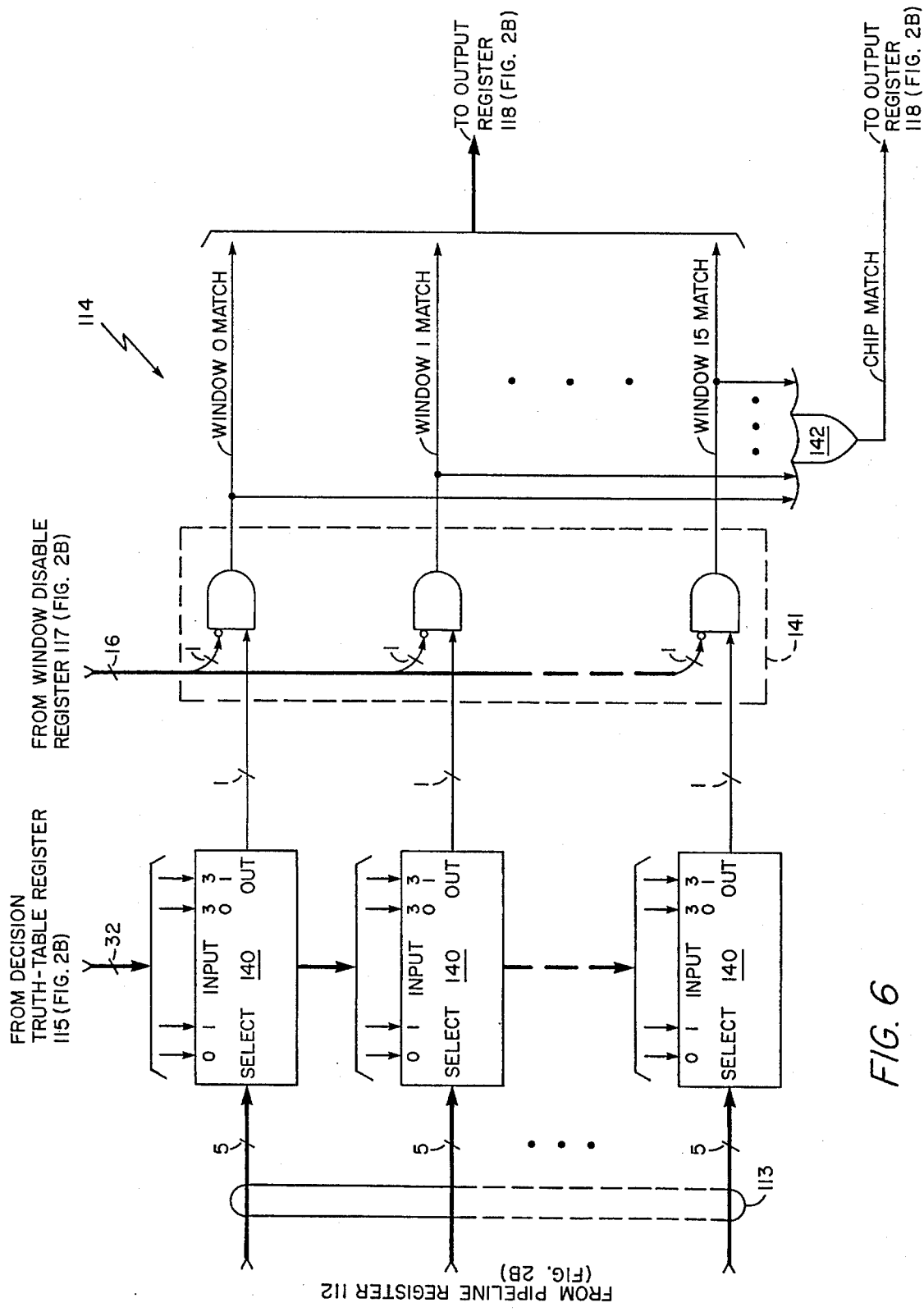
FIG. 6 is a block diagram of the decision logic shown in FIG. 2B.

FIG. 6 diagrams the decision logic 114 (FIG. 2B). Multiplexers 140 individually select one of 32 inputs as specified by a five bit select input. Each five bit select input is generated by corresponding match outputs from switch matrix 133 (FIG. 4A) via pipeline register 112 and bus 113 (FIG. 2B). For each combination of bracket matching, there is an input to the multiplexers 140. This allows any combination of bracket match/no match conditions for producing a match on a particular bracket. For example, an exemplary bracket match pattern could be: match: A, B, C and E, no match on D; or match on B, D and E, no match on A, C is a don't care. Then a bracket match would be:

$$AB C \overline{D} E + \overline{A} B D E$$
$$= AB C \overline{D} E + \overline{A} B D E (C + \overline{C})$$
$$= AB C \overline{D} E + \overline{A} B C D E + \overline{A} B \overline{C} D E$$

if a match is a "1" and "0" is no match, then the select inputs for a match are:

$$11101_2, \quad 01111_2, \quad 01011_2$$
$$= 29, \quad 15, \quad 11 \text{ (decimal)}$$

Therefore, if bits 11, 15 and 29 are set to a "1" in the decision truth table register 115 (FIG. 2B), such bits correspond to the 11, 15 and 29 inputs of multiplexers 140. When a combination of bracket match bits on bus 113 matches the exemplary bracket match pattern above, the corresponding multiplexer 140 output (or outputs) go to a "1" indicating the corresponding window matched the input word. AND gate array 141 disables a multiplexer 140 output when a corresponding bit is set in the bracket disable register 117 (FIG. 2B). OR elate 142 produces a summary bit indicating a hatch occured in the memory.

An alternate mode of operation of the CLAM 13 (FIGS. 2A, 2B), compares an applied window to stored data. Referring to FIGS. 3A, 3B, corresponding registers of registers 121, 122 contains identical data words to be matched. The low window data register 102a (FIG. 2A) contains the lower limits and high window data register 102b (FIG. 2A) contains the upper limits. Each compare and partition circuit 123 compares the corresponding data applied to inputs H1, L1 (the applied data on H1 being identical to the applied data on L1) to the window applied to inputs H2, L2. Results of the comparisons are passed to pipeline register 112 (FIG. 28) via bus 111 for processing by decision logic 114 (FIG. 2B).

Having described a preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. In a window addressable memory for determining whether an input word has a value in any one of a plurality of windows specified by the values of a plurality of pairs of reference words stored in a storage means, the value of one such reference word in each pair designated as a lower limit and the value of the other such reference word of each pair designated as an upper limit, an improvement allowing the window addressable memory to partition the input word and each word of all pairs of reference words into subfields of adjacent bits and to determine whether the value of each partition of the first word is in the range specified by the values of the corresponding partitions of the reference words, said improvement comprising:

(a) input accepting means for accepting a first control input specifying the number of bits in each of said subfields;

(b) partitioning means, responsive to the first control input, for partitioning the input word and each pair of reference words;

(c) a plurality of comparison means, one for each pair of reference words, responsive to the partitioning means and responsive to the input word and the reference words, said comparison means producing a first Boolean output signal for each subfield in each pair of reference words indicating whether the value of the corresponding subfield in the input word is within the range specified by the value of the corresponding subfield of the lower limit reference word and the value of the corresponding subfield of the upper limit reference word.

2. The improved window addressable memory recited in claim 1 containing, additionally, logic means responsive to a second control input and to each one of the first Boolean output signals of the comparison means, said logic means producing a second Boolean output signal for each of the plurality of reference word pairs, each one of the second Boolean output signals of the logic means indicating whether the values of the first Boolean output signals match a pattern specified by the control input.

3. The improved window addressable memory recited in claim 1 wherein each comparison means comprises:

(a) a first comparison means, responsive to the partitioning means, for comparing the word designated as the lower limit reference word to the input word, to produce a first intermediate signal indicating whether the value of each subfield in the input word is greater than the value of the corresponding subfield in the lower limit reference word;

(b) a second comparison means for comparing the input word to the word designated as the upper limit reference word, to produce a second intermediate signal indicating whether the value of each subfield in the input word is less than the value of the corresponding subfield in the upper limit reference word;

(c) combining means, responsive to the the first and second intermediate signals and the partitioning means, said combining means producing a plurality of outputs, one for each subfield, the outputs indicating whether the output of the first comparison means indicates the value of the corresponding subfield of the input word is greater than the value of the corresponding subfield in the lower limit reference word and the output of the second comparison means indicates the value of the corresponding subfield if the input word is less than the value of the corresponding subfield in the upper limit reference word.

4. The improved window addressable memory recited in claim 1 wherein each of the comparison means is responsive to a control input such that it produces the first Boolean output signal for each subfield in a single reference word stored in the storage means, said first Boolean output signal indicating whether the value of the corresponding subfield in the reference word is within the range specified by the value of the corresponding subfield in a first input word and the value of the corresponding subfield in a second input word.

\* \* \* \* \*